(12) United States Patent
Wall, Jr.

(10) Patent No.: US 7,316,488 B2
(45) Date of Patent: Jan. 8, 2008

(54) BEAM SHUTTER IN LED PACKAGE

(75) Inventor: Franklin J. Wall, Jr., Vacaville, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 35 days.

(21) Appl. No.: 11/053,091

(22) Filed: Feb. 7, 2005

(65) Prior Publication Data

US 2006/0175626 A1 Aug. 10, 2006

(51) Int. Cl.
*F21V 11/00* (2006.01)
*B60Q 1/08* (2006.01)

(52) U.S. Cl. .................... 362/351; 362/538

(58) Field of Classification Search ............ 362/248, 362/296, 301, 247, 545, 290–292, 303, 308, 362/329, 335, 341, 344, 555, 800, 538, 351
See application file for complete search history.

(56) References Cited

U.S. PATENT DOCUMENTS

| 6,945,672 | B2* | 9/2005 | Du et al. ................ 362/241 |
| 6,960,007 | B2* | 11/2005 | Ishida et al. ............ 362/538 |
| 7,005,679 | B2* | 2/2006 | Tarsa et al. ............. 257/89 |
| 2003/0142500 | A1* | 7/2003 | Bachl et al. ............ 362/373 |

* cited by examiner

*Primary Examiner*—Sandra O'Shea
*Assistant Examiner*—James W Cranson, Jr.
(74) *Attorney, Agent, or Firm*—Patent Law Group LLP; Brian D. Ogonowsky

(57) ABSTRACT

A beam shutter is disclosed that is affixed to an LED die submount or circuit board to sharply define the emitted pattern. The beam shutter may be a solid piece of aluminum or any other opaque material to block a portion of the light emitted from the LED die. The beam shutter is particularly advantageous for shaping the LED light for car headlamps.

29 Claims, 4 Drawing Sheets

BEAM SHUTTER IN LED PACKAGE

FIELD OF THE INVENTION

This invention relates to light emitting diodes (LEDs) and, in particular, to a technique for controlling the beam of the LED.

BACKGROUND

LED dies typically emit light in a lambertian pattern. It is known to use a lens over the LED die to narrow the beam or to make a side-emission pattern. It is difficult to form lenses for certain patterns, and typical LED lenses cannot sharply define a light beam. In some applications, such as headlights, a sharply defined non-symmetrical emission pattern may be desired, which cannot be adequately produced with a conventional lens.

SUMMARY

A beam shutter is disclosed that is affixed to the LED die submount or circuit board to sharply define the emitted pattern. The beam shutter may be a solid piece of aluminum or any other opaque material to block a portion of the light emitted from the LED die. The beam shutter is particularly advantageous for shaping the LED light for car headlamps.

DETAILED DESCRIPTION

Figure 1:
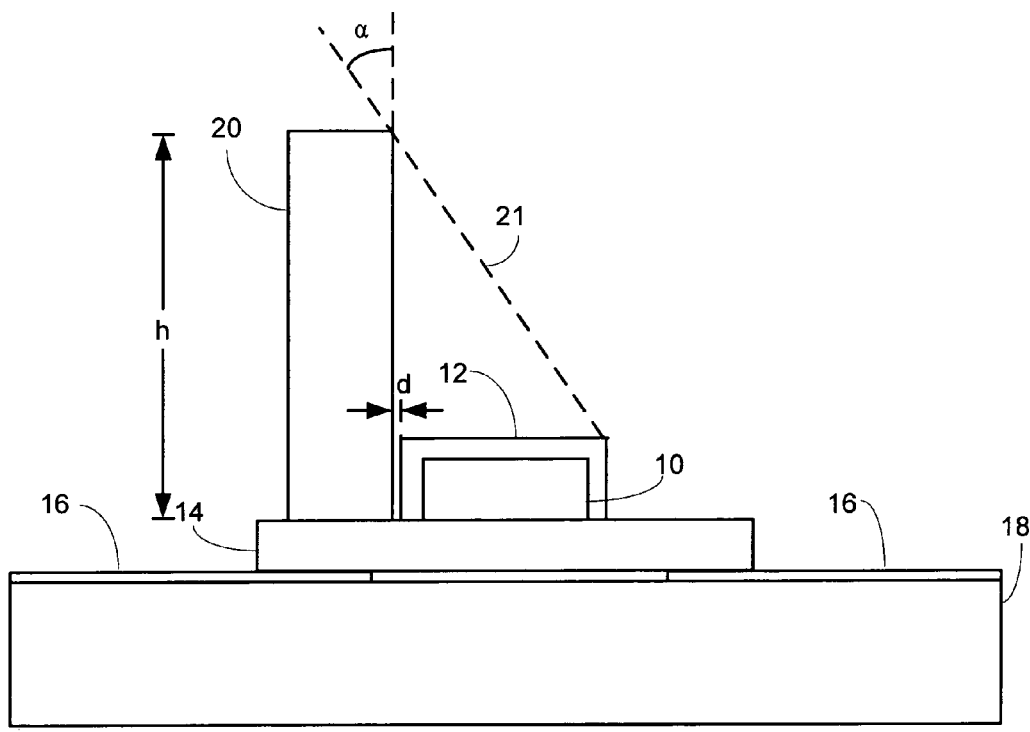
FIG. 1 is a side view of a phosphor-coated LED die with a beam shutter mounted next to the die.

As a preliminary matter, a conventional LED is formed on a growth substrate. In the example used, the LED is a GaN-based LED, such as an AlInGaN or InGaN LED, for producing blue light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package substrate contact pads. Current from the n-metal contact initially flows laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a package substrate contact pad.

Other types of LEDs that can be used in the present invention include AlInGaP LED, which can produce light in the red to yellow range.

Examples of forming LEDs are described in U.S. Pat. Nos. 6,649,440 and 6,274,399, both assigned to Lumileds and incorporated by reference.

A flip-chip LED is used in the examples of FIGS. 1-4; however, a wire bond LED may be used instead.

After the LEDs are diced, they may be tested for parameters such as color and brightness and then binned (grouped with LEDs having similar attributes).

The diced LEDs may be optionally coated with a phosphor by various known methods. The phosphor is energized by the light emitted by the LED die and emits a different wavelength. In one embodiment, the LED die emits blue light, and the phosphor emission in conjunction with the blue light results in a white light being generated. For example, the phosphor may contribute a yellow component or red and green components to the blue light to create white light. Such an LED structure can be used as a car headlamp if the light output energy is sufficient. Such a headlamp can be realized using an array of high power LEDs. The shape of a headlamp beam is mandated by industry and government standards.

To efficiently shape the light beam emitted from an LED, such as for a headlamp, one or more beam shutters are affixed proximate to the LED die to selectively block the emitted light to achieve the desired emission pattern. If the beam shutter material is reflective, such as aluminum, the beam shutter also reflects the impinging light in the desired direction of emission.

Figure 2:
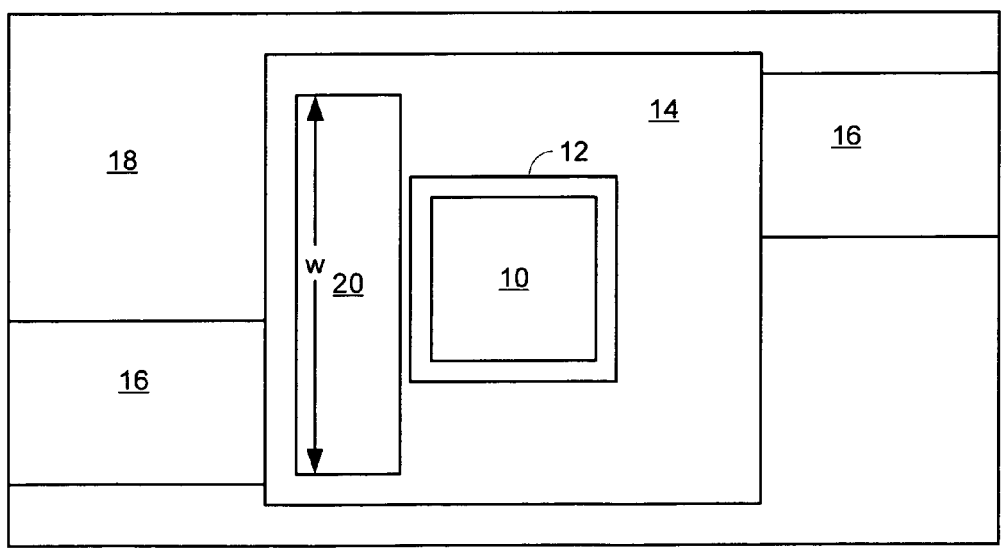
FIG. 2 is a top down view of the structure of FIG. 1.

FIG. 1 is a cross-sectional view of an LED die 10 coated with a phosphor 12 so that the light emitted is white light. FIG. 2 is a top down view of the structure of FIG. 1.

LED die 10 is mounted on a submount 14. Submount 14 may be a silicon slab having metal contact pads and leads formed thereon using conventional plating or lithographic processes. N and P metal contacts on the bottom of LED die 10 (for a flip-chip example) are bonded (e.g., soldered) to corresponding metal pads on the top of submount 14. The top metal pads are electrically coupled to metal pads on the bottom of submount 14 by vias through submount 14. Such a structure is well known in the art. Alternatively, all electrical contacts to submount 14 may be made from the top of submount 14.

The bottom metal pads of the submount 14 are bonded to metal leads 16, which are coupled to a power supply or to other LEDs. Leads 16 may be traces on a circuit board 18 or other support structure. Circuit board 18 may include an insulated aluminum substrate so as to conduct heat away from the LED die 10. An array of LED dice may be mounted on board 18 to provide the desired light output. Multiple LED dice may be mounted on a single submount 14, which may interconnect the LED dice in series and/or parallel.

A beam shutter 20, of any shape, is affixed to submount 14 by any suitable adhesive or by any other means. In one embodiment, beam shutter 20 is soldered, brazed, or ultrasonically welded to a metal pad on submount 14. In another embodiment, beam shutter 20 is glued, using an epoxy, to submount 14. Beam shutter 20 may be formed of aluminum or any other material.

FIG. 1 shows beam shutter 20 limiting the emitted beam 21 to an angle of α off the vertical line. The LED light emission that is not blocked by shutter 20 is unimpeded so that the light pattern will be asymmetrical. If an LED array using beam shutter 20 for each LED die were employed as a card headlamp, the light would be directed forward and downward, with any upward light limited by the beam shutter.

The height, shape, angle, and location of the beam shutter determine the emission pattern. The height (h) may range from slightly thicker than the LED die (e.g., 1/10 mm) to several millimeters, depending on the desired pattern. The shutter should be adjacent to the LED die or submount for best control over the light pattern. The angle of the shutter may be other than perpendicular to the emitted light so as to reflect the light in a certain direction. Typical widths (w) of the shutter (see FIG. 2) are 1-15 mm. Typical heights (h) of the shutter are 0.1-10 mm. And typical distances (d) of the shutter from the die (or LED lens) are 0-5 mm.

Figure 3:
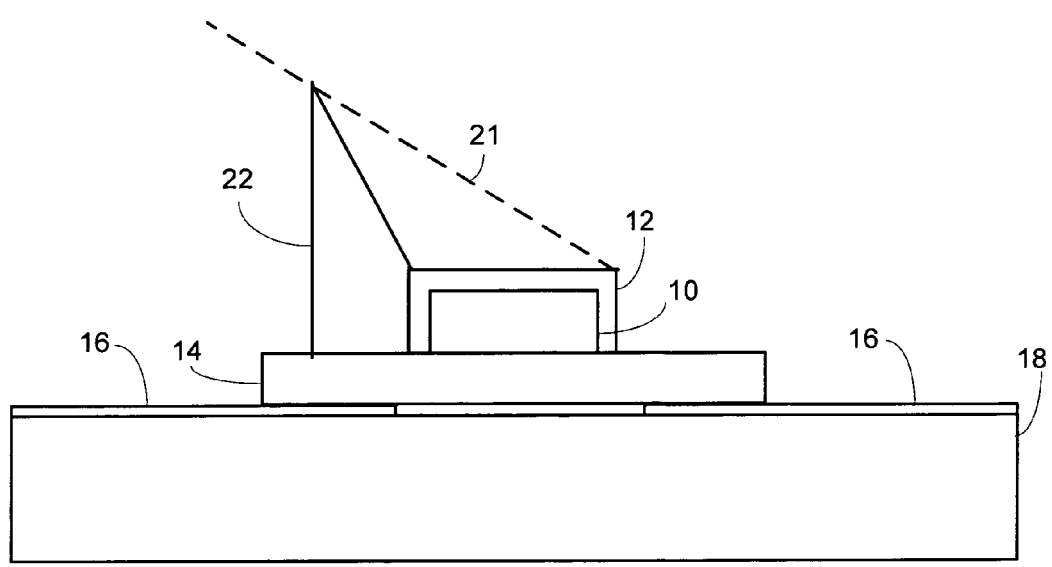
FIG. 3 is a cross-sectional view of an LED die with a different shaped beam shutter mounted next to the die.

FIG. 3 is a cross-sectional view of another shape of beam shutter 22 affixed to submount 14. Beam shutter 22 has an angled edge. Such an angled edge sharpens the definition of the light pattern.

Figure 4:
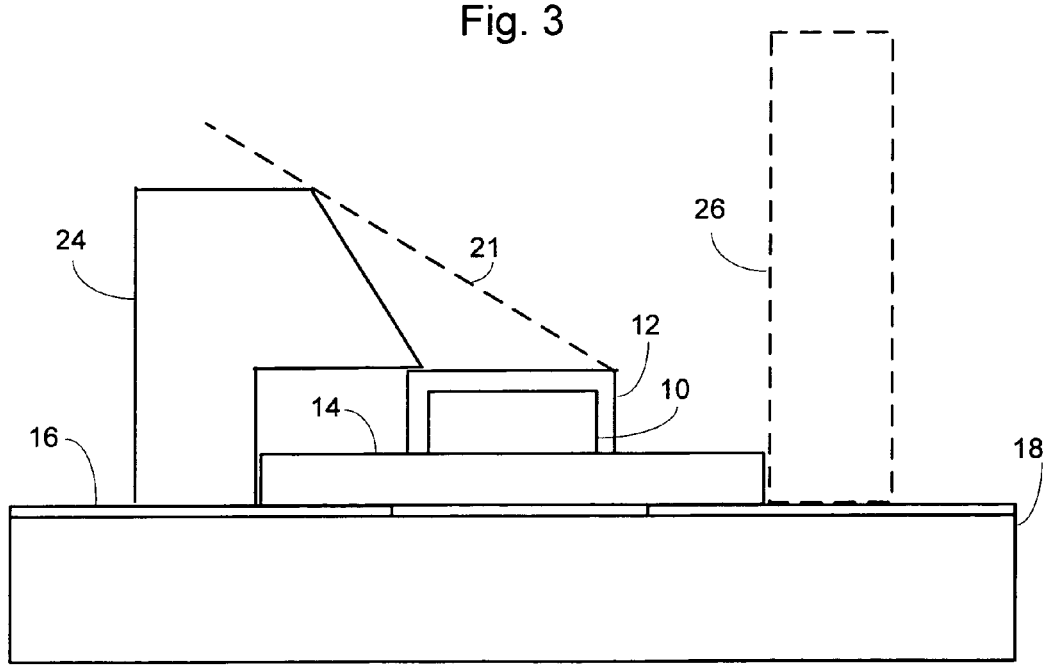
FIG. 4 is a cross-sectional view of an LED die with a beam shutter mounted on a support surface such as a circuit board, heat sink, or other surface.

FIG. 4 is a cross-sectional view of another shape of beam shutter 24 affixed to the circuit board 18 or any other support structure. Beam shutter 24 may be affixed with solder, brazing, an ultrasonic weld, an epoxy, or using any other suitable means. FIG. 4 illustrates in dashed outline the use of a second beam shutter 26 for further defining the light emission pattern.

Figure 5:
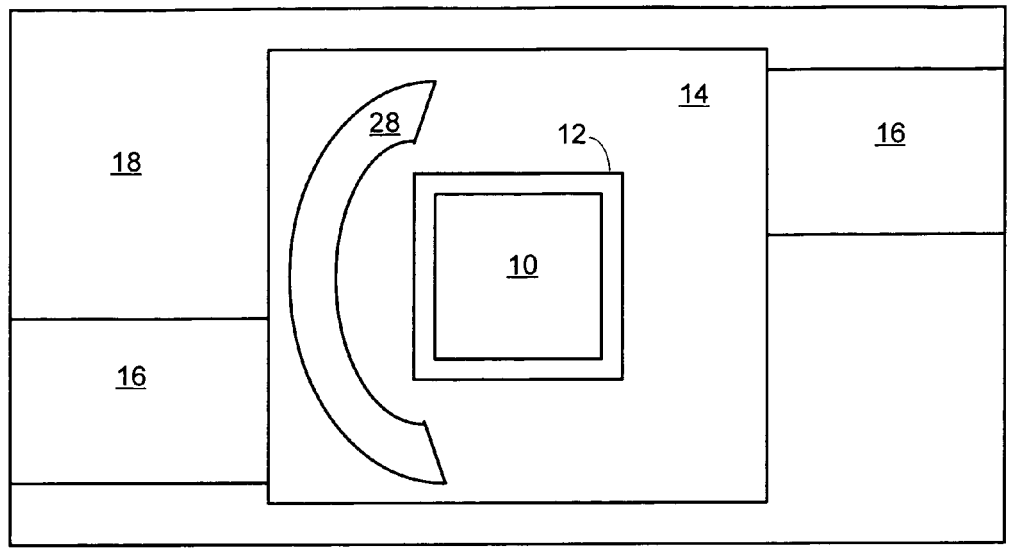
FIG. 5 is a top down view of a curved (e.g., parabolic) shutter.

FIG. 5 is a top down view of a structure, similar to FIG. 2, having a beam shutter 28 that is curved. The curve may act to intercept more light or may act to focus the light like a parabolic lens. The curve may even be in the reverse direction to reflect the light in a sideways pattern.

Figure 6:
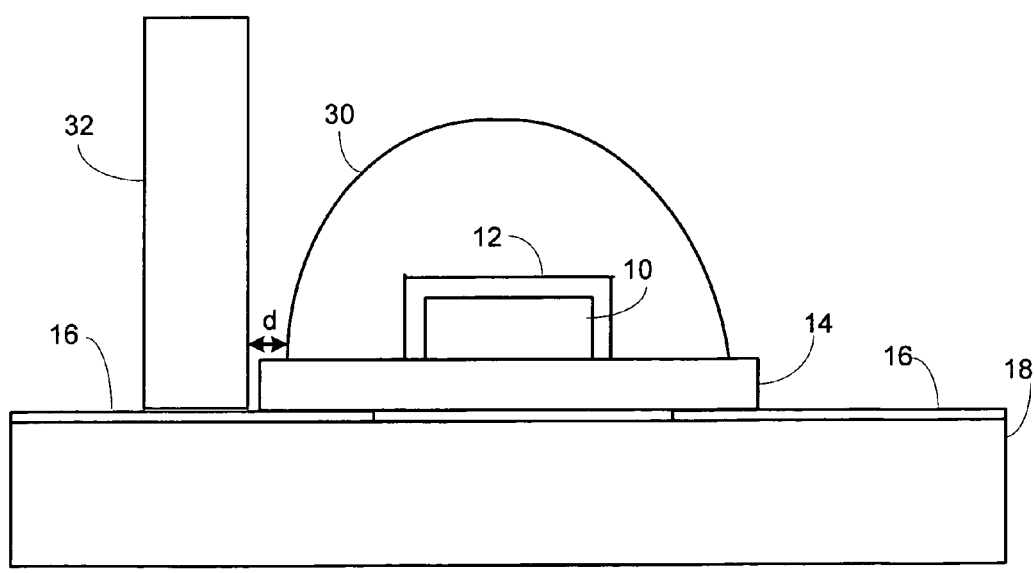
FIG. 6 is a cross-sectional view of a beam shutter next to an LED die with a lens.

FIG. 6 illustrates how an LED die may have a lens 30 formed over it or affixed to it. Beam shutter 32 may be inside or outside of lens 30. Lens 30 further shapes the emitted light. Lens 30 may be a collimating lens, a side-emitting lens, or any other design. A phosphor material for converting the LED light to white light (or any other color light) may be deposited over lens 30 or may form part of the lens material itself, such as by mixing phosphor powder in the liquid lens material prior to forming the lens. Such phosphors are well known.

Figure 7:
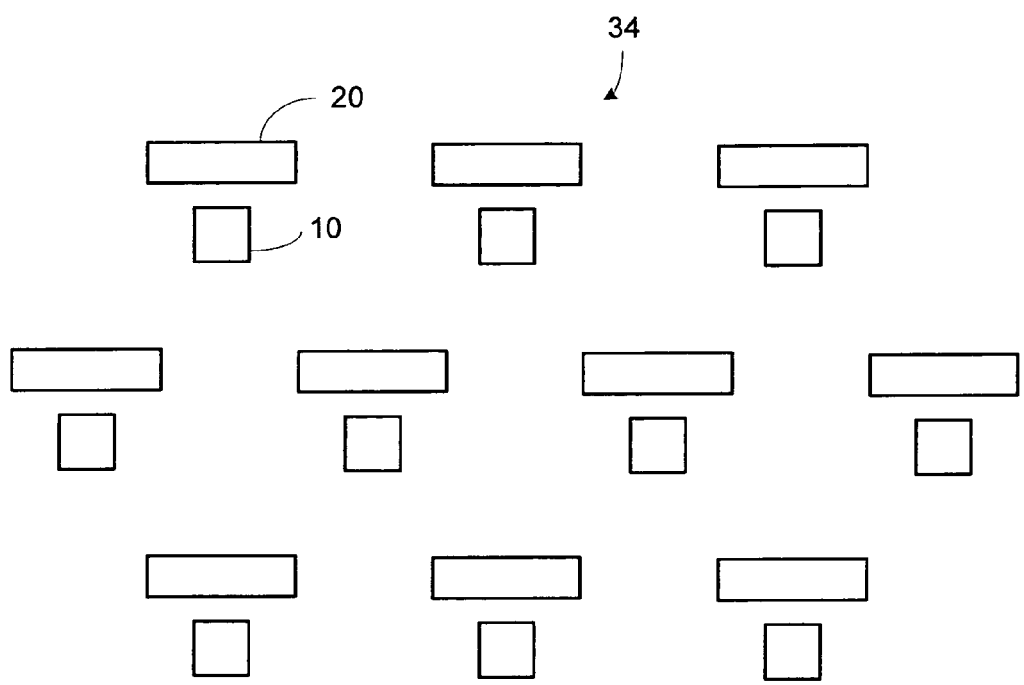
FIG. 7 is an abstract view of an array of LED dice, each having an associated beam shutter for shaping the overall light pattern of the array.

FIG. 7 illustrates an array 34 of LED dice 10 along with their associated beam shutter 20. The array may be mounted on a circuit board using an aluminum substrate. Such an array may be useful for a car headlamp, where the beam shutters 20 limit the upward emission of light. The array may be housed in a cup-shaped mirror with a single lens, similar to a conventional headlamp. In another embodiment, a single beam shutter may selectively block light emitted from multiple LED dice. The beam shutters may also be used in conjunction with LED dies having lenses.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a light emitting diode (LED) die;
   a mounting surface supporting the LED die, the LED die having a circumference in a plane parallel to the mounting surface; and
   an opaque beam shutter affixed to the mounting surface proximate to the LED die for shaping a light emission pattern, the beam shutter being provided around a portion, but not all, of the circumference of the LED die so that the beam shutter blocks light directly emitted by the LED die through a portion of the circumference but does not block light through a remaining portion of the circumference, the beam shutter causing an asymmetrical light pattern to be created,
   wherein no part of the beam shutter resides directly over a top surface of the LED die so as to not block or reflect light that has been emitted by the LED die in a direction perpendicular to the top surface of the LED die.

2. The device of claim 1 wherein the mounting surface is a surface of a submount for the LED die, the submount having one or more electrical contacts bonded to contacts on the LED die.

3. The device of claim 2 wherein the submount comprises silicon.

4. The device of claim 1 wherein the mounting surface comprises a surface of a circuit board.

5. The device of claim 1 wherein the beam shutter is adhesively affixed to the mounting surface.

6. The device of claim 5 wherein the beam shutter is adhesively affixed by solder, by brazing, or by an ultrasonic weld.

7. The device of claim 5 wherein the beam shutter is adhesively affixed by epoxy.

8. The device of claim 1 wherein the beam shutter is reflective.

9. The device of claim 1 wherein the beam shutter is aluminum.

10. The device of claim 1 wherein the beam shutter is substantially rectilinear.

11. The device of claim 1 wherein the beam shutter comprises a wall that is curved partially around the circumference of the LED die.

12. The device of claim 1 further comprising a lens over the LED die.

13. The device of claim 1 further comprising phosphor overlying at least a portion of the LED die for converting light from the LED die to a different wavelength.

14. The device of claim 13 wherein the phosphor converts the LED light to generate white light.

15. The device of claim 13 wherein the phosphor is deposited on the LED die.

16. The device of claim 13 wherein the phosphor is on or in a lens overlying the LED die.

17. The device of claim 1 wherein the beam shutter has a width along a circumference of the LED die, wherein the width of the beam shutter is 1-15 mm.

18. The device of claim 1 wherein the beam shutter has a height perpendicular to the mounting surface, wherein the height of the beam shutter is 0.1-10 mm.

19. The device of claim 1 wherein a distance of a closest surface of the beam shutter from the LED die is 0-5 mm.

20. The device of claim 1 further comprising a lens over the LED die, wherein a distance of a closest surface of the beam shutter from the lens is 0-5 mm.

21. A method of producing a light pattern comprising:
providing a light emitting diode (LED) die on a mounting surface, the LED die having a circumference in a plane parallel to the mounting surface;
providing an opaque beam shutter affixed to the mounting surface proximate to the LED die, the beam shutter being provided around a portion, but not all, of the circumference of the LED die so that the beam shutter blocks light directly emitted by the LED die through a portion of the circumference but does not block light through a remaining portion of the circumference, the beam shutter causing an asymmetrical light pattern to be created, wherein no part of the beam shutter resides directly over a top surface of the LED die so as to not block or reflect light that has been emitted by the LED die in a direction perpendicular to the top surface of the LED die; and
energizing the LED die to emit light such that a portion of the emined light is blocked by the beam shutter for shaping a light emission pattern and creating an asymmetrical light emission pattern.

22. The method of claim 21 wherein energizing the LED die comprises energizing the LED die to emit light such that a portion of the emitted light is blocked and reflected by the beam shutter for shaping a light emission pattern.

23. The method of claim 21 wherein the beam shutter has a width along a circumference of the LED die, wherein the width of the beam shutter is 1-15 mm.

24. The method of claim 21 wherein the beam shutter has a height perpendicular to the mounting surface, wherein the height of the beam shutter is 0.1-10 mm.

25. The method of claim 21 wherein a distance of a closest surface of the beam shutter from the LED die is 0-5 mm.

26. The method of claim 21 wherein a lens is over the LED die, and wherein a distance of a closest surface of the beam shutter from the lens is 0-5 mm.

27. The device of claim 1 further comprising a submount for the LED die, wherein the mounting surface comprises a surface of a circuit board on which the submount is mounted.

28. The device of claim 1 wherein the LED die has a top surface, a bottom surface, and four sides, the beam shutter being positioned only along one of the four sides of the LED die.

29. The device of claim 1 wherein the beam shutter comprises a wall that has a wedge shaped top edge, the top edge tapering away from the LED die.

* * * * *

UNITED STATES PATENT AND TRADEMARK OFFICE
CERTIFICATE OF CORRECTION

PATENT NO. : 7,316,488 B2 Page 1 of 1
APPLICATION NO. : 11/053091
DATED : January 8, 2008
INVENTOR(S) : Franklin J. Wall, Jr.

It is certified that error appears in the above-identified patent and that said Letters Patent is hereby corrected as shown below:

Column 5, line 19, Claim 21: Cancel "emined" and substitute --emitted--.

Signed and Sealed this

Seventeenth Day of June, 2008

JON W. DUDAS
*Director of the United States Patent and Trademark Office*